United States Patent
Zhang

(10) Patent No.: US 11,990,355 B2
(45) Date of Patent: May 21, 2024

(54) METHOD AND SYSTEM FOR SCHEDULING APPARATUSES ON PRODUCTION LINE

(71) Applicant: BEIJING NAURA MICROELECTRONICS EQUIPMENT CO., LTD, Beijing (CN)

(72) Inventor: Shangui Zhang, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 288 days.

(21) Appl. No.: 16/197,997

(22) Filed: Nov. 21, 2018

(65) Prior Publication Data

US 2019/0096724 A1 Mar. 28, 2019

Related U.S. Application Data

(63) Continuation of application No. PCT/CN2016/113666, filed on Dec. 30, 2016.

(30) Foreign Application Priority Data

Sep. 28, 2016 (CN) .......................... 201610861929.2

(51) Int. Cl.
*H01L 21/67* (2006.01)
*G05B 19/4155* (2006.01)
(Continued)

(52) U.S. Cl.
CPC .... *H01L 21/67276* (2013.01); *G05B 19/4155* (2013.01); *G06Q 10/06* (2013.01);
(Continued)

(58) Field of Classification Search
None
See application file for complete search history.

(56) References Cited

U.S. PATENT DOCUMENTS 5,050,088 A * 9/1991 Buckler ........... G05B 19/41835
700/96
5,568,623 A 10/1996 Ogawa
(Continued)

FOREIGN PATENT DOCUMENTS

| CN | 101179043 A | 5/2008 |
| CN | 102129393 A | 7/2011 |

(Continued)

OTHER PUBLICATIONS

Nai Qi Wu, Mengchu Zhou, Feng Chu, and Sa"Id Mammar, "Modeling, Analysis, Scheduling, and Control of Cluster Tools in Semiconductor Fabrication," 2015, John Wiley & Sons, Inc (Year: 2015).*

(Continued)

*Primary Examiner* — Sara Grace Brown
(74) *Attorney, Agent, or Firm* — ANOVA LAW GROUP, PLLC

(57) ABSTRACT

A method and a system for scheduling apparatuses in a production line are disclosed. Each of the apparatuses on the production line includes one or more functional modules, each of the functional modules have a task sequence, and a task sequence includes one or more tasks. The method includes: obtaining a queuing time required for executing each of the tasks in the task sequence of the functional module; identifying a task that has a shortest queuing time in the task sequence as a target task; executing the target task; removing the target task from the task sequence and obtaining an updated queuing time required for executing each of the tasks in the task sequence. The method divides the apparatuses on the production line apparatus into a (Continued)

plurality of independent functional modules and executes the task having the shortest queuing time first with respect to each of the functional modules. It can be guaranteed to minimize an overall queuing time for each of the functional modules of the apparatuses on the production line during the scheduling process. Therefore, the scheduling efficiency can be increased.

20 Claims, 2 Drawing Sheets

(51) Int. Cl.
  *G06Q 10/06* (2023.01)
  *G06Q 10/0631* (2023.01)
  *G06Q 50/04* (2012.01)
(52) U.S. Cl.
  CPC ....... *G06Q 10/06316* (2013.01); *G06Q 50/04* (2013.01); *G05B 2219/34418* (2013.01); *Y02P 90/02* (2015.11)

(56) References Cited

U.S. PATENT DOCUMENTS

| | | | | |
|---|---|---|---|---|
| 5,832,224 | A * | 11/1998 | Fehskens | H04L 41/042 709/223 |
| 5,928,389 | A * | 7/1999 | Jevtic | H01L 21/67745 29/25.01 |
| 7,440,811 | B2 | 10/2008 | Giebels et al. | |
| 7,474,934 | B2 * | 1/2009 | Ji | H01L 21/67276 700/121 |
| 2005/0080660 | A1 | 4/2005 | Desilva et al. | |
| 2008/0216077 | A1 * | 9/2008 | Emani | G05B 19/41865 718/102 |
| 2009/0055829 | A1 * | 2/2009 | Gibson | G06F 9/4881 718/103 |
| 2009/0132332 | A1 * | 5/2009 | Belenky | G06Q 10/06311 705/7.13 |
| 2009/0143911 | A1 * | 6/2009 | Gage | H01L 21/67196 700/248 |
| 2011/0217148 | A1 * | 9/2011 | Nakata | H01L 21/677 414/217 |
| 2011/0218662 | A1 * | 9/2011 | Nakata | H01L 21/67742 700/112 |
| 2011/0270574 | A1 * | 11/2011 | Cruse | H01L 21/67276 702/176 |
| 2012/0252141 | A1 * | 10/2012 | Sundararajan | H01L 21/32139 257/E21.525 |
| 2013/0102159 | A1 * | 4/2013 | Kotani | H01L 21/67276 438/758 |
| 2013/0183443 | A1 * | 7/2013 | Hirose | C23C 16/45544 118/712 |
| 2013/0338811 | A1 | 12/2013 | Zhang et al. | |
| 2014/0067110 | A1 * | 3/2014 | Lawson | G05B 19/41885 700/117 |
| 2014/0358271 | A1 * | 12/2014 | Asakawa | G05B 19/41865 700/112 |
| 2015/0212517 | A1 * | 7/2015 | Huang | G05B 19/41865 700/112 |
| 2015/0277993 | A1 * | 10/2015 | Gu | G06F 9/455 718/102 |
| 2015/0311710 | A1 | 10/2015 | Shen et al. | |
| 2016/0103713 | A1 * | 4/2016 | Norman | G06Q 10/06316 718/103 |
| 2016/0307783 | A1 * | 10/2016 | Iida | H01L 21/0228 |
| 2017/0017520 | A1 * | 1/2017 | Nakazawa | H04L 67/1002 |
| 2017/0080563 | A1 * | 3/2017 | Wu | G05B 19/41885 |
| 2017/0083008 | A1 * | 3/2017 | Wu | G05B 19/4187 |
| 2017/0083010 | A1 * | 3/2017 | Wu | G05B 19/41865 |
| 2018/0024536 | A1 * | 1/2018 | Yoneda | H01L 21/67011 438/14 |
| 2018/0082878 | A1 * | 3/2018 | Qiao | H01L 21/67745 |
| 2019/0013223 | A1 * | 1/2019 | Saito | H01L 21/67184 |

FOREIGN PATENT DOCUMENTS

| | | |
|---|---|---|
| CN | 102662744 A | 9/2012 |
| CN | 103902375 A | 7/2014 |
| KR | 20010085714 A | 9/2001 |
| KR | 100957401 B1 | 5/2010 |
| KR | 20140102940 A | 8/2014 |
| KR | 20160077432 A | 7/2016 |
| TW | I271669 B | 1/2007 |

OTHER PUBLICATIONS

"proceed," Dec. 12, 2023, Merriam Webster (Year: 2023).*
Wu, NaiQi, and MengChu Zhou. "A closed-form solution for schedulability and optimal scheduling of dual-arm cluster tools with wafer residency time constraint based on steady schedule analysis." IEEE Transactions on Automation Science and Engineering 7.2 (2009): 303-315. (Year: 2009).*
Zhang, Weijun, Theodor Freiheit, and Huashu Yang. "Dynamic scheduling in flexible assembly system based on timed Petri nets model." Robotics and Computer-Integrated Manufacturing 21.6 (2005): 550-558. (Year: 2005).*
The World Intellectual Property Organization (WIPO) International Search Report for PCT/CN2016/113666 Jun. 22, 2017 6 Pages.

* cited by examiner

METHOD AND SYSTEM FOR SCHEDULING APPARATUSES ON PRODUCTION LINE

CROSS-REFERENCE TO RELATED APPLICATION

This application is a continuation application of International Application No. PCT/CN2016/113666, filed on Dec. 30, 2016, which claims priority to Chinese Patent Application No. 201610861929.2, filed on Sep. 28, 2016. The above enumerated patent applications are incorporated herein by reference.

TECHNICAL FIELD

The present disclosure relates to the field of process control technology, and more particularly, to a method and a system for scheduling apparatuses on a production line.

TECHNICAL BACKGROUND

Cluster scheduling problems refer to the problems encountered during the semiconductor fabrication process when multiple transmission platforms and multiple process chambers are simultaneously used and loaded to meet production requirements. Cluster scheduling problems include complicated wafer transmission paths and scheduling methods in the fabrication process. In recent years, with the rapid development of the fabrication technology in the semiconductor industry, the requirements for production capacity of semiconductor apparatuses have become higher and higher in the fabrication process. With respect to apparatuses of different fabrication processes on a production line, an efficient and reliable scheduling algorithm is significant in improving the production capacity of the semiconductor apparatuses.

The scheduling algorithm of apparatuses on a production line is a relatively complex nondeterministic polynomial-time (NP) combinatorial optimization problem. There are no mature polynomial algorithms or optimization theories that can be used and cited as a reference to determine a scheduling algorithm, and only some specific optimization methods can be used to seek a solution.

Therefore, a technical problem that currently needs to be solved by those skilled in the art is to provide a scheduling method to satisfy complex scheduling requirements and to increase the production capacity of the semiconductor apparatuses.

SUMMARY OF THE DISCLOSURE

A technical problem to be solved by the present disclosure is to provide a method for scheduling apparatuses on a production line to optimize the complex scheduling tasks and increase the production capacity of apparatuses on the production line.

Correspondingly, the present disclosure also provides a system for scheduling the apparatuses on the production line to implement and apply the above scheduling method.

To solve the scheduling problem, one aspect of the present disclosure provides a method for scheduling apparatuses on a production line, where each of the apparatuses may include one or more functional modules, each of the functional modules may have a task sequence, and each task sequence may include one or more tasks.

The method may include: obtaining a queuing time required for executing each of the tasks in a task sequence of a functional module; identifying a task that has a shortest queuing time in the task sequence as a target task; executing the target task; and removing the target task from the task sequence and obtaining an updated queuing time required for executing each of the tasks in the task sequence.

In some embodiments, after the removing the target task from the task sequence, the method may further include: adding a new task in the task sequence.

In some embodiments, adding the new task in the task sequence may include: acquiring the new task; determining whether a number of tasks in the task sequence reaches a threshold number. If the number of the tasks in the task sequence is below the threshold number, the new task is added to the task sequence; and if the number of the tasks in the task sequence reaches the threshold number, the new task is stopped from being added to the task sequence.

In some embodiments, the functional module may include one or more states, and the states may include an idle state, a busy state, and an unavailable state. If the functional module corresponding to the task sequence is in the idle state, the new task is added to the task sequence. If the functional module corresponding to the task sequence is in the busy state or in the unavailable state, the new task is stopped from being added to the task sequence.

In some embodiments, the queuing time may be determined as follows: acquiring a first time required for the functional module to enter the idle state; acquiring a second time required to complete an adjustment operation for each of the tasks in the task sequence; acquiring the third time required to complete a preceding task for each of the tasks in the task sequence; and obtaining the queuing time by summing the first time, the second time and the third time.

In some embodiments, the task sequences of the functional modules may include a same threshold number.

In some embodiments, the functional modules may include an atmospheric robot, and tasks of the atmospheric robot may include: taking a wafer out of a cassette and sending the wafer to an aligner; loading the wafer aligned by the aligner to a loadlock; and taking the wafer out of the loadlock and sending the wafer to the cassette.

In some embodiments, the functional modules may include the loadlock, and tasks of the loadlock may include: pumping the loadlock to an atmospheric condition; exhausting the loadlock to a vacuum condition; sending a wafer out of the loadlock; and receiving a wafer into the loadlock.

In some embodiments, the functional modules may include a vacuum robot, and tasks of the vacuum robot may include: sending a wafer from a loadlock to a process chamber of a first process; sending the wafer from the process chamber of the first process to a process chamber of a second process; and sending the wafer from the process chamber of the second process to the loadlock.

In some embodiments, the functional module may include the process chamber, and tasks of the process chamber may include: opening a chamber valve; executing a process flow of the wafer; and closing the chamber valve.

In addition, the present disclosure provides a system for scheduling apparatuses on the production line, where the each of the apparatuses on the production line may include one or more functional modules, each of the functional modules may include a task sequence, and the task sequence may include one or more tasks. The system may include: a queuing-time calculating module configured to obtain, in a task sequence of a functional modules, a queuing time required for executing each of the tasks in the task sequence; a target-task identifying module configured to identify a task that has a shortest queuing time in the task sequence as a target task; an executing module configured to execute the target task; and a calling module configured to call the queuing-time calculating module after removing the target task from the task sequence.

In some embodiments, the system may further include: a task adding module, configured to add a new task to the task sequence after removing the target task from the task sequence; and the calling module, configured to call the queuing-time calculating module after the task adding module removes the target task from the task sequence.

In some embodiments, the task adding module may include: a new-task acquiring sub-module configured to acquire the new task; a determining sub-module configured to determine whether the number of tasks in the task sequence reaches a threshold number; an adding sub-module, configured to add the new task to the task sequence if the number of tasks in the task sequence is below the threshold number; and a stopping sub-module configured to stop adding the new task in the task sequence if the number of tasks in the task sequence reaches the threshold number.

In some embodiments, each of the functional module may have one or more states, and the states may include an idle state, a busy state and an unavailable state. The adding sub-module may include: an adding unit, configured to add the new task in the task sequence if the functional module corresponding to the task sequence is in an idle state; and a stopping unit, configured to stop adding the new task in the task sequence if the functional module corresponding to the task sequence is in a busy state or an unavailable state.

In some embodiments, the queuing time may be determined by following modules: a first-time acquiring module configured to acquire a first time required for the functional module to enter the idle state; a second time acquiring module, configured to acquire a second time required to complete an adjustment operation for each of the tasks in the task sequence; a third-time acquiring module configured to acquire a third time required to complete a preceding task for each of the tasks in the task sequence; and a obtaining module configured to obtain the queuing time by summing the first time, the second time and the third time.

In some embodiments, the task sequences of the functional modules may include a same threshold number.

In some embodiments, the functional module may include an atmospheric robot, and tasks of the atmospheric robot may include: taking a wafer out of a cassette and sending the wafer to an aligner; loading the wafer aligned by the aligner to a loadlock; and taking the wafer out of the loadlock and sending the wafer to the cassette.

In some embodiments, the functional module may include the loadlock, and tasks of the loadlock may include: pumping the loadlock to an atmospheric condition; exhausting the loadlock to a vacuum condition; sending a wafer out of the loadlock; and receiving a wafer into the loadlock.

In some embodiments, the functional module may include a vacuum robot, and tasks of the vacuum robot may include: sending a wafer from a loadlock to a process chamber of a first process; sending the wafer from the process chamber of the first process to a process chamber of a second process; and sending the wafer from the process chamber of the second process to the loadlock.

In some embodiments, the functional module may include a process chamber, and tasks of the process chamber may include: opening a chamber valve; executing a process flow of the wafer; and closing the chamber valve.

Compared with existing technologies, the present disclosure may have following advantages. The present disclosure divides apparatuses on a production line into a plurality of independent functional modules and analyzes tasks to be executed in the task sequence of each of the modules. The task having the shortest queuing time may be performed first with respect to each of the functional modules. Thus, it can be guaranteed to minimize an overall queuing time for each of the functional modules of the apparatus on the production line during a scheduling process. Therefore, the scheduling efficiency can be increased, leading to increasing the production capacity of apparatus on the production line.

DETAILED DESCRIPTION

Figure 1:
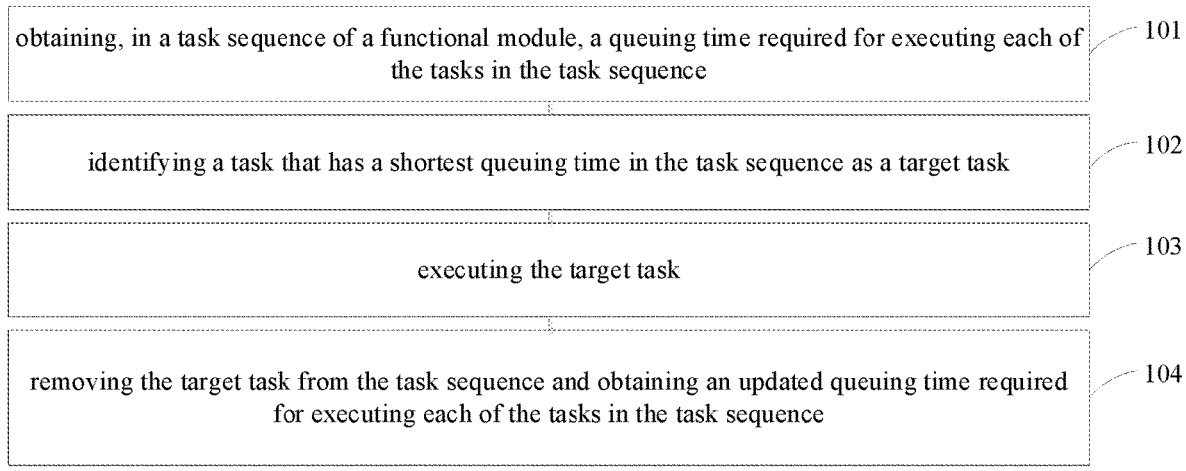
FIG. 1 is a flow chart of a method for scheduling apparatuses on a production line according to some embodiments of the present disclosure.

To make objects, features, and advantages of the present disclosure clearer, the present disclosure is further described in detail with reference to the accompanying drawings and specific embodiments.

Scheduling problems with a relatively smaller computational scale and less complexity of computation can be solved using a traditional heuristic method or a mathematical programming method.

A heuristic algorithm is referenced with respect to an optimization algorithm. The optimization algorithm for a problem is to identify an optimal solution for each instance of the problem. The traditional heuristic algorithm mainly adopts commonly-used local search strategies, has a relatively simple algorithm calculation process, and can be easily implemented by software programs. A basic strategy of using the traditional heuristic algorithm to solve a cluster scheduling problem is using the local search strategy, e.g. a Greedy algorithm, and a Tabu Search, during a scheduling process. It can ensure that certain stages or certain specific scheduling modules in the scheduling process are able to save time to the maximum extent, thereby locally improving the efficiency of the scheduling system. The heuristic algorithm in this case is an algorithm based on an intuitive or a forbidden term (Tabu) construction and gives a feasible solution for each instance of a combined optimization problem to be solved at an acceptable cost (only time and space is calculated). The deviation of the feasible solution from the optimal solution cannot be predicted in advance. Therefore, the scheduling path designed by the heuristic algorithm is not necessarily optimal and may only be a relatively better solution, a feasible solution, or could even be a solution with poor performance. Moreover, this method is only for the scheduling problem with a relatively smaller computational scale. For scheduling problems with complex scheduling requirements and a large computational scale, the heuristic algorithm would be difficult to implement.

The basic strategy of a mathematical programming method is to transform the cluster scheduling problem into a common graph theory problem or a mathematical programming problem, use an existing algorithm theory (e.g. Petri Net and Integer programming, etc.) to establish a mathematical programming model (an objective function and constraint conditions) for the scheduling problem, and use a traditional mathematical programming method (e.g. genetic algorithms and neural networks, etc.) or other mathematical tools to establish the model, so as to solve the problem. The basic strategy of using a mathematical programming method to solve the scheduling problem is to transform the cluster scheduling problem into a common graph theory problem or a mathematical programming problem, use an existing algorithm theory, e.g. Petri Net and Integer programming, etc. to establish a mathematical programming model (including an objective function and constraint conditions) for the scheduling problem, and use a traditional mathematical programming method (e.g. genetic algorithms and neural networks, etc.) with other mathematical tools to establish the model, so as to obtain the optimal solution of the problem. Compared with the traditional heuristic algorithm, generally, the mathematical programming method can obtain an optimal solution of the problem, but the mathematical programming method also has obvious limitations. The mathematical programming method usually needs to establish a very complex mathematical model, which needs a very complicated process to establish the model. It is therefore difficult to be implemented by using software programming and can only be built offline with help of software tools. As a result, this method may be difficult to implement and difficult to use. On the other hand, the mathematical programming method can only solve a problem with simple scheduling requirements. For a complex scheduling problem, the mathematical programming method may also not be applicable.

In view of the limitations of the design methods of the existing scheduling algorithms, the present disclosure adopts a dynamic programming method to design the scheduling algorithm of apparatuses on a semiconductor production line.

One of the core concepts of the present disclosure is to divide a scheduling transmission system of the apparatuses into individual functional modules and analyze a task sequence to be executed by each module in a certain period next. For each module, under certain conditions, a task that requires a shortest queuing time may be executed first.

FIG. 1 shows a flow chart of a method for scheduling apparatuses on a production line according to some embodiments of the present disclosure, where the apparatuses may include one or more functional modules, each of the functional module may include a task sequence, and each task sequence may include one or more tasks. The method may include:

In 101: a queuing time required for executing each of the tasks in a task sequence of a functional module may be obtained.

In some embodiments, the apparatus on a production line may include an apparatus in semiconductor fabrication process, such as a hardmask process apparatus, an etch apparatus, and a physical vapor deposition apparatus, etc.

Each of the apparatuses on the production line may be divided into one or more functional modules, each of the functional modules may include a task sequence, and each task sequence may include tasks to be executed by the functional module. Each functional module may include one or more hardware and/or software components. Internal structures and associated program instructions of an apparatus may be divided into one or more functional modules to accomplish all or part of functions performed by the apparatus. By means of the functional modules, the functions of an apparatus can be represented in a structural manner. In the following, divisions of the functional modules for an apparatus are only used as an example. In practical applications, an allocated function may be executed by a different functional module according to an actual need. For example, in a hardmask process apparatus, the functional module may include an atmospheric robot. Tasks to be executed in a task sequence of the atmospheric robot may include: taking a wafer out of a cassette and sending the wafer to an aligner; loading the wafer aligned by the aligner to a loadlock; and taking the wafer out of the loadlock and sending the wafer to the cassette.

For the apparatuses on the production line, a key factor to increase the production capability of the apparatuses is to optimize the task scheduling algorithm for each functional module. The present disclosure is based on the dynamic programming strategy, and in a working process of the apparatuses on the production line, each functional module may execute the task that requires the shortest queuing time.

In 102: a task having the shortest queuing time in the task sequence may be identified as a target task.

In the task sequence of the functional module, the queuing time of each task may be obtained, and the task with the shortest queuing time may be identified as the target task, which may be first executed by the functional module.

In 103: the target task may be executed.

In 104: after the target task is removed from the task sequence, and an updated queuing time for executing each of the tasks in the task sequence may be obtained.

After the functional module starts executing the target task, the executed target task may be removed from the task sequence of the functional module, the queuing time of each task in the task sequence may be updated, and the task with the shortest queuing time may be identified as the target task again.

The present disclosure divides each apparatus on a production line into one or more independent functional modules and analyzes tasks to be executed in the task sequence of each of the functional modules. The task that has the shortest queuing time may be executed first. Thus, it can be guaranteed to minimize an overall queuing time for each of the functional modules of the apparatus on the production line during the scheduling process. Therefore, the scheduling efficiency can be increased, leading to an increasing production capacity of the apparatus on the production line.

Figure 2:
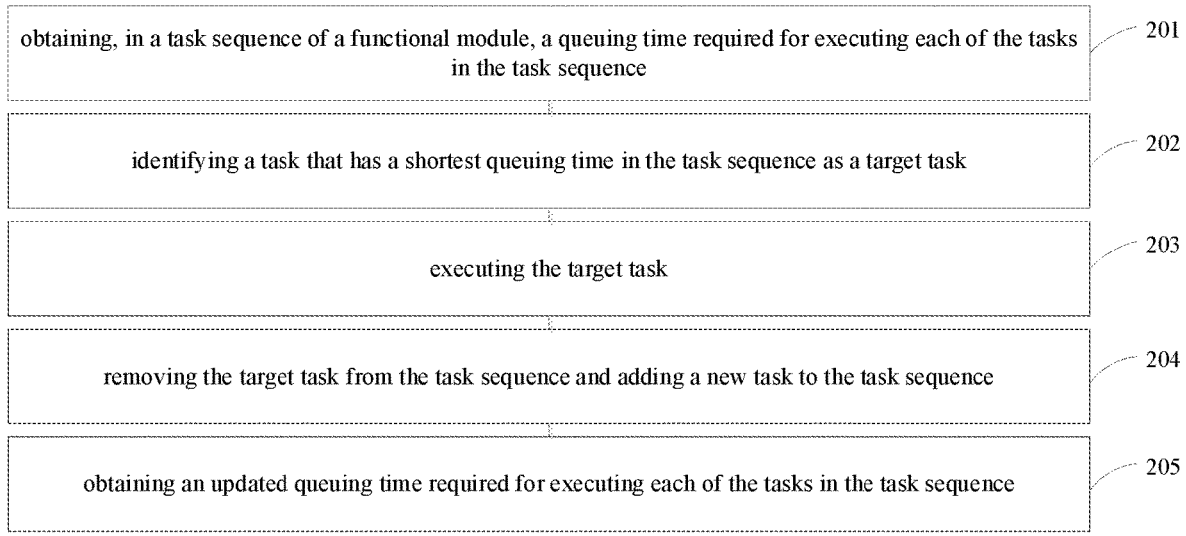
FIG. 2 is a flow chart of another method for scheduling apparatuses in a production line according to some embodiments of the present disclosure.

FIG. 2 shows a flow chart of another method for scheduling apparatuses in a production line according to some embodiments of the present disclosure, where each of the apparatuses on a production line may include one or more functional modules, each of the functional modules may have a task sequence, and the task sequence may include one or more tasks. The method may include:

In 201: a queuing time required for executing each of the tasks in the task sequence may be obtained.

In some embodiments of the present disclosure, a hardmask apparatus as an apparatus on a production line is described as an example.

In some embodiments, the functional modules of the hardmask apparatus may include an atmospheric robot, a loadlock, a vacuum robot, and a process chamber. Here, the process chamber may include a process chamber that executes a first process and a process chamber that executes a second process.

In some embodiments, a process flow of the hardmask apparatus may include that the atmospheric robot takes a wafer out of a cassette and loading the wafer on an aligner for alignment and calibration.

After the calibration is completed, the atmospheric robot may take the wafer out of the aligner and send the wafer to a loadlock in an atmospheric condition. In the atmospheric condition, the pressure inside the loadlock is equal to an atmospheric pressure.

After the wafer is placed in the loadlock, an atmospheric end door of the loadlock may be closed immediately, and the loadlock may be exhausted to a vacuum condition.

The vacuum robot in a transfer chamber may take the wafer out of the loadlock and send the wafer to each process chamber for processing, at which time, the loadlock may be in a vacuum condition.

After the wafer completes related processes in the process chamber, the vacuum robot may take out the wafer and place the wafer in the loadlock, and then the atmospheric robot may take the wafer out of the loadlock and place the wafer in the cassette.

After the wafer is taken out of the loadlock, a vacuum end door of the loadlock may be closed immediately, and the loadlock may be pumped to an atmospheric condition.

Tasks of the atmospheric robot may include: (1) taking a wafer out of a cassette and sending the wafer to an aligner; (2) loading the wafer aligned by the aligner to a loadlock; and (3) taking the wafer out of the loadlock and sending the wafer to the cassette.

Tasks of the loadlock may include: (1) pumping the loadlock to an atmospheric condition; (2) exhausting the loadlock to a vacuum condition; (3) sending a wafer out of the loadlock and receiving a wafer into the loadlock.

Tasks of the vacuum robot may include: (1) sending a wafer from a loadlock to a process chamber of a first process; (2) sending the wafer from the process chamber of the first process to a process chamber of a second process; and (3) sending the wafer from the process chamber of the second process to the loadlock.

Tasks of the Process Chamber may include: (1) opening a chamber valve; (2) executing a process flow of the wafer; and (3) closing the chamber valve.

Those skilled in the art should understand that the division of the functional modules and the task setting of each functional module are merely examples of the present disclosure, and those skilled in the art can obtain functional modules using other division manner and tasks of each module in other manners. The present disclosure is not limited herein.

In 202: a task that has the shortest queuing time in the task sequence may be identified as a target task.

The queuing time may refer to a duration from the current time until the task is started to be executed.

In some embodiments of the present disclosure, the queuing time can be determined as follows: 1) acquiring a first time required for the functional module to enter the idle state; 2) acquiring a second time required to complete an adjustment operation for each of the tasks in the task sequence; 3) acquiring a third time required to complete a preceding task for each of the tasks in the task sequence; and 4) obtaining the queuing time by summing the first time, the second time, and the third time.

In some embodiments of the present disclosure, the queuing time may include a duration required for the functional module to complete the current task execution, an adjustment time of the functional module, and a queuing time of a preceding task.

An idle state may refer to a state where the functional module is not executing any task. If a functional module is executing a task, the functional module may be defined as being in a busy state. The first time is the time required for the functional module to complete the current task execution.

The adjustment operation may refer to an operation required between two tasks. Tasks for each functional module may not necessarily continuous. After one task execution is completed, the functional module may need a certain adjustment operation before executing the next task.

The preceding task may refer to a task before a certain task in the process flow, and the preceding task of the task may be executed by the same functional module or other functional modules.

The time required for the adjustment operation is further described by an example below.

For example, tasks of the vacuum robot include: task 1: transporting the wafer from container A to container B; task 2: transporting the wafer from container B to container C; task 3: transporting the wafer from container C to containers A.

For example, after the vacuum robot performs task 1, task 2 and task 3 in the task sequence can be selected. After the execution of task 1, the vacuum robot is in a position of the container B. It can be assumed that the vacuum robot can execute task 2 immediately in the position of container B. That is, task 2 can be executed immediately after task 1.

Whereas, if to execute task 3, the vacuum robot needs to move to a position of the container C before an execution of task 3 can be started. That is, task 3 of the vacuum robot cannot be executed immediately after task 1, and an adjustment operation is needed before the execution of task 3 can be started. Therefore, the adjustment operation increases the queuing time of task 3.

It should be noted that the adjustment operations may differ depending on the task settings. In fact, each task is composed of one or more operations. The adjustment operation can also be considered as part of the task.

The time required for the preceding task is further described by an example below.

For example, the tasks of the atmospheric robot may include: task 1: taking a wafer out of a cassette and sending the wafer to an aligner; task 2: loading the wafer aligned by the aligner to a loadlock; and task 3: taking the wafer out of the loadlock and sending the wafer to the cassette.

According to the above-mentioned specific process flow of the hardmask apparatus, task 1 of the atmospheric robot is the first task in the process, i.e., there is no preceding task for the task 1. The preceding tasks for task 2 is task 1, and task 2 can be executed after task 1.

Whereas task 3 can only be executed after executing related tasks of task 1 and task 2 in sequence. That is, task 3 cannot be executed until the execution of preceding tasks, i.e., task 1 and task 2, is complete.

In 203: the target task may be executed.

In 204: a new task may be added in the task sequence after the target task is removed from the task sequence.

In some embodiments of the present disclosure, adding a new task in the task sequence may include the following:

In S11: a new task may be acquired. The new task to be executed by the functional module may be acquired.

In S12: it may be determined that whether the number of tasks in the task sequence reaches a threshold number.

In some embodiments, a length may be set for the task sequence of each of the functional modules; and the length may refer to a maximum number of tasks that can be included in the task sequence. For example, the length of the task sequence of the atmospheric robot is 3, i.e., up to 3 tasks can be included in the task sequence of the atmospheric robot.

After a new task is acquired, if the number of tasks in the task sequence has reached the threshold number, the addition of the new task in the task sequence may be stopped. If the number of tasks in the task sequence is below the threshold number, the new task may be added to the task sequence.

In some examples of the present disclosure, the task sequences of the functional modules may include the same threshold number, i.e. the threshold number of each task sequence is the same. For example, the length of the task sequence of each functional module may be 3, i.e., the number of tasks that can be included in the task sequence of each functional module is 3.

In S13: if the number of tasks in the task sequence is below the threshold number, the new task may be added in the task sequence.

In S14: if the number of tasks in the task sequence reaches the threshold number, the addition of the new task in the task sequence may be stopped.

Further, in some embodiments of the present disclosure, the functional module may have one or more states, and the states may include: an idle state, a busy state, and an unavailable state.

Adding the new task in the task sequence may include: if the functional module is in an idle state, adding the new task to the task sequence; and if the functional module is in a busy or an unavailable state, stopping adding the new task to the task sequence.

Each functional module may have three states: the idle state, the busy state, and the unavailable state. The idle state may refer to that the functional module is not executing any task. The busy state may refer to that the functional module is executing a task. The unavailable state may refer to that the functional module cannot execute any task. For example, if a functional module fails, the functional module is in the unavailable state.

During a scheduling process of the apparatuses on the production line, the state of each functional module may be updated in a real time manner.

If the functional module is in an idle state, the new task may be added in the task sequence of the functional module; if the functional module is in a busy or an unavailable state, the addition of the new task to the task sequence of the functional module may be stopped.

The new task may be added only after the state of functional module changes from the busy state to the idle state. That is, only after the functional module completes executing a certain task, the new task may be added in the task sequence of the functional module.

In 205: 201 is reprocessed, i.e. an updated queuing time required for executing each of the tasks in the task sequence may be obtained.

201 to 205, as shown in FIG. 2, may be repeated until the scheduling is completed, i.e., a predetermined number of wafers are processed and completed.

In some embodiments of the present disclosure, the hardmask apparatus may be divided into four functional modules including: the atmospheric robot, the loadlock, the vacuum robot, and the process chamber, and the length of the task sequence of each functional module is the same. In the scheduling process, each of the functional modules may first execute the task with the shortest queuing time in the task sequence, which ensures that the total queuing time of the functional modules of the hardmask apparatus is as short as possible, thereby improving the scheduling efficiency.

A simulation result of tasks of a functional module according to the present disclosure is described below.

In a simulation experiment of the hardmask apparatus, the hardmask apparatus is divided into four functional modules including: the atmospheric robot, the loadlock, the vacuum robot, and the process chamber. The process chamber may include a process chamber that performs process 1 and a process chamber that performs process 2. Among them, the quantity of process chambers for process 1 is 2, the quantity of process chambers for process 2 is 2, the quantity of loadlocks is 1, and the quantity of aligner is 1. Therefore, the quantity of wafers that the hardmask apparatus can accommodate at the same time is 7. If the capacity of the cassette is 25, the scheduling process of the hardmask apparatus is to process 25 wafers of one cassette.

In the simulation experiment, the tasks of the functional module are represented by numbers for convenience of description.

For example, the tasks of the atmospheric robot may include: task 1: taking a wafer out of a cassette and sending the wafer to an aligner; task 2: loading the wafer aligned by the aligner to a loadlock; and task 3: taking the wafer out of the loadlock and sending the wafer to the cassette.

The simulation result is as the followings:

Initial task sequence: (1, 2, 1, 2, 1, 2, 1, 2, 1, 2, 1, 2, 1, 2)

Cyclic task sequence: (1, 2, 3) cycles 18 times

Ending task sequence: (3, 3, 3, 3, 3, 3, 3)

In the simulation according to the method of the present disclosure, the simulation is performed with the strategy that the functional module first executes the task with the shortest queuing time. The simulation result of scheduling tasks for the atmospheric robot to process the 25 wafers in the cassette is that the atmospheric robot first executes 7 cycles of task 1-task 2 consecutively; after the 7th cycle, executes 18 cycles of task 1-task 2-task 3 consecutively; and after the 18th cycle, executes 7 cycles of task 3.

The above content is only an example according to the present disclosure. The simulation result of the task performed by the atmospheric robot may also change correspondingly according to the apparatus parameters setting of the hardmask apparatus during the simulation. For example, the quantity of same functional modules and time required for the functional module to execute a task, etc., may affect the simulation result.

For simple description, the method embodiments are expressed as a series of action combinations, but those skilled in the art should know that the present disclosure is not limited by the described action sequence. According to the present disclosure, certain actions may be performed in other sequences or simultaneously. In addition, those skilled in the art should understand that embodiments described in the specification all belong to optional examples of the present disclosure, and some involved actions are not necessarily required by the present disclosure.

Figure 3:
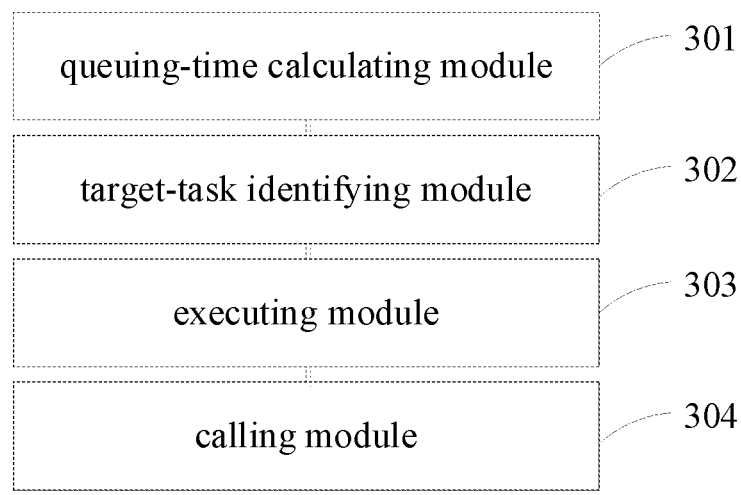
FIG. 3 is a schematically structural block diagram of a system for scheduling apparatuses in a production line according to some embodiments of the present disclosure.

FIG. 3 shows a schematically structural block diagram of a system for scheduling apparatuses on a production line according to some embodiments of the present disclosure, where each of the apparatuses on the production line may include one or more functional modules, each of the functional modules may include a task sequence, and each task sequence may include one or more tasks. The system may include: a queuing-time calculating module 301 configured to obtain, in a task sequence of a functional modules, a queuing time required for executing each of the tasks in the task sequence; a target-task identifying module 302 configured to identify a task that has a shortest queuing time in the task sequence as a target task; an executing module 303 configured to execute the target task; and a calling module 304 configured to call the queuing-time calculating module after removing the target task from the task sequence.

The present disclosure may divide apparatuses on the production line into a plurality of independent functional modules and analyze tasks to be performed in the task sequence of each of the modules. The task that has the shortest queuing time in the task sequence may be executed first. Thus, it can be guaranteed to minimize an overall queuing time for each of the functional modules of each apparatus on the production line during the scheduling process. Therefore, the scheduling efficiency can be increased, leading to an increasing production capacity of the apparatus on the production line.

According to the present disclosure, the system may further include: a task adding module configured to add a new task to the task sequence after removing the target task from the task sequence; and the calling module further configured to call the queuing-time calculating module after the task adding module removes the target task from the task sequence.

According to the present disclosure, the task adding module may include: a new-task acquiring sub-module configured to acquire the new task; a determining sub-module configured to determine whether a number of tasks in the task sequence reaches a threshold number; an adding sub-module configured to add the new task to the task sequence if the number of the tasks in the task sequence is below the threshold number; and a stopping sub-module configured to stop adding the new task to the task sequence if the number of the tasks in the task sequence reaches the threshold number.

According to the present disclosure, the functional module has one or more states, and the states may include: an idle state, a busy state, and an unavailable state.

In this case, the adding sub-module may include: an adding unit configured to add the new task to the task sequence if the functional module corresponding to the task sequence is in an idle state; and a stopping unit configured to stop adding the new task to the task sequence if the functional module is in a busy state or in an unavailable state.

According to the present disclosure, the queuing time can be determined by the following modules: a first-time acquiring module configured to acquire a first time required for the functional module to enter the idle state; a second-time acquiring module configured to acquire a second time required to complete an adjustment action for each of the tasks in the task sequence; a third-time acquiring module configured to acquire a third time required to complete a proceeding ask for each of the tasks in the task sequence; and an obtaining module configured to obtain the queuing time by summing the first time, the second time, and the third time.

In some embodiments of the present disclosure, the task sequences of the functional modules may include a same threshold number.

In some embodiments of the present disclosure, the functional module may include an atmospheric robot, and tasks of the atmospheric robot may include: taking a wafer out of a cassette and sending the wafer to an aligner; loading the wafer aligned by the aligner to a loadlock; and taking the wafer out of the loadlock and sending the wafer to the cassette.

In some embodiments of the present disclosure, the functional module may include a loadlock, and tasks of the loadlock may include: pumping the loadlock to an atmospheric condition; exhausting the loadlock to a vacuum condition; sending a wafer out of the loadlock; and receiving a wafer into the loadlock In some embodiments of the present disclosure, the functional module may include a vacuum robot, and tasks of the vacuum robot may include: sending a wafer from a loadlock to a process chamber of a first process; sending the wafer from the process chamber of the first process to a process chamber of a second process; and sending the wafer from the process chamber of the second process to the Loadlock.

In some embodiments of the present disclosure, the functional module may include a process chamber, and tasks of the process chamber may include: opening a chamber valve; executing a process flow of the wafer; and closing the chamber valve.

Because the system embodiment is basically similar to the method embodiment, description of system embodiment is relatively simple, so related parts can refer to description of the method embodiment.

Each embodiment in this specification is described in a progressive manner. Each embodiment focuses on difference from other embodiments, and the same or similar parts among the embodiments of the present disclosure can be referred to each other.

Those skilled in the art should understand that embodiments of the present disclosure may be provided as a method, an apparatus, or a computer program product. Thus, the present disclosure may take a form of an entirely hardware embodiment, an entirely software embodiment, or an embodiment combining software and hardware aspects. Furthermore, the present disclosure may take a form of a computer program product implemented on one or more computer-usable storage media (including, but not limited to, disk storage, CD-ROMs, and optical memories, etc.) having computer-usable program code embodied therein.

For example, the method as provided in the present disclosure may be realized by a processor and a storage medium that is coupled to the processor. The storage medium may be configured to store a computer program that, when executed by the processor, causes the processor to execute, for example, the disclosed method described above with reference to FIGS. 1 and 2 and any variation thereof.

The computer program stored in the storage medium may be configured with computer program codes, including, for example, computer program modules. In some embodiments, the codes in the computer program may include one or more computer program modules that correspond to the disclosed functional modules. It should be noted that the division manner and the number of the modules may be not fixed, and those skilled in the art may apply appropriate modules or any combination of program modules according to actual situations.

The present disclosure is described with reference to the flow charts and/or block diagrams of the method, the terminal device (system), and the computer program product according to the present disclosure. Each flow and/or block in the flowcharts and/or block diagrams, and combinations of the flows and/or blocks in the flow charts and/or block diagrams may be implemented by computer program instructions. The computer program instructions may be provided to a processor of a general-purpose computer, a special-purpose computer, an embedded processor, or other programmable data processing terminal device to generate a machine. Therefore, instructions may be executed by a processor of a computer or other programmable data processing terminal device to generate a device to implement functions specified in one or more flows and/or blocks in flowcharts and/or block diagrams.

These computer program instructions can also be stored in a computer readable memory capable of directing a computer or other programmable data processing terminal device to operate in a specific manner, such that instructions stored in the computer readable memory may result in the manufacture of a device that includes an instruction device. The instruction device can implement the functions specified in one or more flows and/or blocks in flowcharts and/or block diagrams.

These computer program instructions can also be loaded onto a computer or other programmable data processing terminal device such that a series of operations can be executed on the computer or other programmable terminal device to generate computer-implemented processes. Therefore, the instructions executed on a computer or other programmable data processing terminal device can provide operations to implement the functions specified in one or more flows and/or blocks in flowcharts and/or block diagrams.

Although embodiments of the present disclosure have been described, those skilled in the art can make additional changes and modifications to these embodiments based on the embodiments. Therefore, the appended claims are intended to be interpreted as including embodiments and all changes and modifications that fall within the scope of the present disclosure.

Finally, it should also be noted that in the present disclosure, relational terms such as first and second, etc., are only used to distinguish one entity or operation from another entity or operation, but do not necessarily require and imply that there is any such actual relationship or sequence between these entities or operations. Moreover, terms "include", "including" or any other variations thereof are intended to cover non-exclusive inclusions such that a process, a method, an article, or a terminal device that includes a series of elements includes not only those elements but also includes unspecified elements or elements inherent in such process, method, article or terminal device. In the case of no more limitation, an element defined by a sentence "include one . . . " does not exclude that there is another same element in the process, the method, the article, or the terminal device that includes the element.

The method and the system for scheduling apparatuses on the production line according to the present disclosure are described in detail above. Specific examples are used herein to describe principles and implementation manners of the present disclosure. Other embodiments of the disclosure may be apparent to those skilled in the art from consideration of the specification and practice of the embodiments disclosed herein. It is intended that the specification and examples be considered as example only and not to limit the scope of the disclosure, with a true scope and spirit of the invention being indicated by the following claims.

What is claimed is:

1. A method for scheduling an apparatus, through a system that includes a processor and the apparatus, in a production line, the method comprising:

dividing, through the processor, the apparatus into a plurality of functional modules including at least two of an atmospheric robot, a loadlock, a vacuum robot, or a process chamber;

identifying and recording, through the processor, basic operations performed by each of the plurality of functional modules, and a task sequence of each of the plurality of functional modules including one or more tasks and each task corresponding to one of the basic operations, the task sequences of the plurality of functional modules include a threshold number, the threshold number indicating a maximum number of the tasks in the task sequence of each of the plurality of functional modules, and the threshold number of the plurality of functional modules being same;

recording, through a timer coupled to the processor, a processing time of each of the basic operations;

detecting, through the processor, states of the plurality of functional modules at a current time, the states including an idle state or a busy state of each of the plurality of functional modules;

calculating, through the timer coupled to the processor for the task sequence corresponding to each functional module of the plurality of functional modules, a queuing time of each task in the task sequence of each functional module required from the current time to a time for executing each of the tasks in the task sequence, wherein calculating the queuing time of each task in the task sequence of each functional module includes:

acquiring a first time required for the functional module to enter the idle state, the first time including a time for the functional module to complete a current task that the functional module currently performs;

acquiring a second time required to complete an adjustment operation for the task in the task sequence adjusted from the current task of the functional module, the adjustment operation being an operation between the current task and a next task;

acquiring a third time required to complete all preceding tasks of the next task in the task sequence of the functional module, the preceding tasks of the next task including one or more certain tasks in the process flow required to be performed by the functional module after the current task and before the next task;

and summing up the first time, the second time, and the third time to provide the queuing time;

for each of the at least two of the atmospheric robot, the loadlock, the vacuum robot, or the process chamber, determining, through the processor, a task that has a shortest queuing time in the task sequence as a target task of the each of the at least two of the atmospheric robot, the loadlock, the vacuum robot, or the process chamber, including:

comparing the queuing time of the tasks that are to be processed in the task sequences of the each of the at least two of the atmospheric robot, the loadlock, the vacuum robot, or the process chamber to obtain the shortest queuing time of the each of the at least two of the atmospheric robot, the loadlock, the vacuum robot, or the process chamber;

determining the task corresponding to the shortest queuing time as the target task that is to be processed of the each of the at least two of the atmospheric robot, the loadlock, the vacuum robot, or the process chamber;

controlling each of the at least two of the atmospheric robot, the loadlock, the vacuum robot, or the process chamber to process the target task that is to be processed of the each of the at least two of the atmospheric robot, the loadlock, the vacuum robot, or the process chamber after the target task is determined, to achieve a shortest overall queuing time of the production line, the target task of the each of the at least two of the atmospheric robot, the loadlock, the vacuum robot, or the process chamber including at least one of transmitting a wafer using the vacuum robot, transmitting the wafer using the atmospheric robot, pumping or exhausting the loadlock, or executing a process flow of the wafer using the process chamber;

and removing, through the processor, the target task from the task sequence of each of the at least two of the atmospheric robot, the loadlock, the vacuum robot, or the process chamber.

2. The method according to claim 1, further comprising:
adding, through the processor, a new task to the task sequence of a corresponding functional module of the plurality of functional modules, after the processor removes the target task from the task sequence and after the state of the corresponding functional module changes from the busy state to the idle state in the production line, wherein adding the new task to the task sequence comprises:
  acquiring the new task;
  determining whether a number of the tasks in the task sequence reaches the threshold number;
  in response to the number of the tasks in the task sequence being below the threshold number, adding the new task to the task sequence; and
  in response to the number of the tasks in the task sequence reaching the threshold number, stopping adding the new task to the task sequence.

3. The method according to claim 1, further comprising:
adding, through the processor, a new task to the task sequence for operations of a corresponding functional module of the plurality of functional modules, after the processor removes the target task from the task sequence and after the state of the functional module changes from the busy state to the idle state in the production line, wherein:
the corresponding functional module further includes an unavailable state; and
adding the new task to the task sequence further comprises:
  in response to the corresponding functional module being in the unavailable state, stopping adding the new task to the task sequence.

4. The method according to claim 1, wherein:
the plurality of functional modules includes the atmospheric robot and the loadlock; and
the basic operations include:
  taking, through the atmospheric robot, the wafer out of a cassette and sending the wafer to an aligner;
  loading, through the atmospheric robot, the wafer aligned by the aligner to the loadlock; and
  taking, through the atmospheric robot, the wafer out of the loadlock and sending the wafer to the cassette.

5. The method according to claim 1, wherein:
the plurality of functional modules includes the loadlock; and
the basic operations include:
  pumping the loadlock to an atmospheric condition;
  exhausting the loadlock to a vacuum condition;
  sending a first wafer out of the loadlock; and
  receiving a second wafer into the loadlock.

6. The method according to claim 1, wherein:
the plurality of functional modules includes the process chamber; and
the basic operations include:
  opening a chamber valve of the process chamber;
  executing the process flow of the wafer;
  and closing the chamber valve.

7. The method according to claim 1, wherein:
the plurality of functional modules includes the vacuum robot and the loadlock; and
the basic operations include, under a vacuum environment:
  transmitting, through the vacuum robot, a wafer from the loadlock to a first vacuum chamber,
  transmitting, through the vacuum robot, the wafer from the first vacuum chamber to a second vacuum chamber, and
  transmitting, through the vacuum robot, the wafer from the second vacuum chamber to the loadlock.

8. The method according to claim 1, further comprising:
in response to the removal of at least one target task of the plurality of the target tasks, calling for the timer to recalculate an updated queuing time to update the task sequence corresponding to the at least one target task, thereby optimizing a scheduling of the tasks and increasing a production capacity of the apparatus in the production line.

9. The method according to claim 1, wherein:
the queueing time of the tasks to be processed in the task sequences of the plurality of functional modules are calculated before the tasks to be processed in the task sequences are processed; and
the target task having the shortest queuing time is determined before the target task is processed.

10. The method according to claim 1, wherein, for each of the task sequences:
the first time, the second time, and the third time are different from each other.

11. The method according to claim 1, wherein:
the plurality of functional modules includes the vacuum robot; and
in response to the current task of the vacuum robot including transporting the wafer from a first container to a second container, and the next task of the vacuum robot including transporting the wafer from a third container to the first container, the second time for the next task of the vacuum robot includes a time for the vacuum robot to move from a position of second container to a position of the third container.

12. The method according to claim 1, wherein:
the plurality of functional modules includes the atmospheric robot and the loadlock; and
in response to the next task of the atmospheric robot including taking the wafer out of the loadlock and sending the wafer to a cassette, the preceding tasks for the next task of the atmospheric robot include taking the wafer out of the cassette and sending the wafer to an aligner, and loading the wafer aligned by the aligner to the loadlock.

13. The method according to claim 1, wherein:
the plurality of functional modules includes the atmospheric robot, the loadlock, the vacuum robot, and a plurality of process chambers, the plurality of process chambers including at least one first process chamber for performing a first process and at least one second process chamber for performing a second process, and the first process being different from the second process.

14. A system for scheduling an apparatus in a production line, comprising the apparatus and a processor configured to:
divide the apparatus into a plurality of functional modules including at least two of an atmospheric robot, a loadlock, a vacuum robot, or a process chamber;
identify and record basic operations performed by each of the plurality of functional modules, and a task sequence of each of the plurality of functional modules including one or more tasks and each task corresponding to one of the basic operations, the task sequences of the plurality of functional modules include a threshold number, the threshold number indicating a maximum number of the tasks in the task sequence of each of the plurality of functional modules, and the threshold number of the plurality of functional modules being same;

record a processing time of each of the basic operations;

detect states of the plurality of functional modules at a current time, the states including an idle state or a busy state of each of the plurality of functional modules;

calculate, for the task sequence corresponding to each functional module of the plurality of functional modules, a queuing time of each task in the task sequence of each functional module required from the current time to a time for executing each of the tasks in the task sequence, wherein the queuing time of each task in the task sequence of each functional module is calculated by the processor and the processor is further configured to:

acquire a first time required for the functional module to enter the idle state, the first time including a time for the functional module to complete a current task that the functional module currently performs;

acquire a second time required to complete an adjustment operation for the task in the task sequence adjusted from the current task of the functional module, the adjustment operation being an operation between the current task and a next task;

acquire a third time required to complete all preceding tasks of the task in the task sequence of the functional module, the preceding tasks of the next task including one or more certain tasks in the process flow required to be performed by the functional module after the current task and before the next task; and sum up the first time, the second time, and the third time to provide the queuing time;

for each of the at least two of the atmospheric robot, the loadlock, the vacuum robot, or the process chamber, determine a task that has a shortest queuing time in the task sequence as a target task of the each of the at least two of the atmospheric robot, the loadlock, the vacuum robot, or the process chamber, including:

comparing the queuing time of the tasks that are to be processed in the task sequences of the each of the at least two of the atmospheric robot, the loadlock, the vacuum robot, or the process chamber to obtain the shortest queuing time of the each of the at least two of the atmospheric robot, the loadlock, the vacuum robot, or the process chamber;

determining the task corresponding to the shortest queuing time as the target task that is to be processed of the each of the at least two of the atmospheric robot, the loadlock, the vacuum robot, or the process chamber;

control each of the at least two of the atmospheric robot, the loadlock, the vacuum robot, or the process chamber to process the target task that is to be processed of the each of the at least two of the atmospheric robot, the loadlock, the vacuum robot, or the process chamber after the target task is determined, to achieve a shortest overall queuing time of the production line, the target task of the each of the at least two of the atmospheric robot, the loadlock, the vacuum robot, or the process chamber including at least one of transmitting a wafer using the vacuum robot, transmitting the wafer using the atmospheric robot, pumping or exhausting the loadlock, or executing a process flow of the wafer using the process chamber;

and remove the target task from the task sequence of each of the at least two of the atmospheric robot, the loadlock, the vacuum robot, or the process chamber.

15. The system according to claim 14, wherein the processor is further configured to:

add a new task to the task sequence for operations of a corresponding functional module, after the processor removes the target task from the task sequence and after the state of the corresponding functional module changes from the busy state to the idle state in the production line, and acquire the updated queuing time required for executing each of the tasks in the task sequence after the target task is removed from the task sequence.

16. The system according to claim 15, wherein the processor is further configured to:

acquire the new task;

determine whether a number of the tasks currently contained in the task sequence of the corresponding functional module reaches the threshold number;

add the new task to the task sequence of the corresponding functional module in response to the number of the tasks in the task sequence being below the threshold number; and stop adding the new task to the task sequence of the corresponding functional module in response to the number of the tasks in the task sequence of the corresponding functional module reaching the threshold number.

17. The system according to claim 15, wherein:

a corresponding functional module of the plurality of functional modules further includes an unavailable state, and the processor is further configured to:

stop adding the new task to the task sequence in response to the corresponding functional module being in the unavailable state.

18. The system according to claim 14, wherein:

the plurality of functional modules includes the atmospheric robot and the loadlock; and the atmospheric robot is configured to:

take a wafer out of a cassette and send the wafer to an aligner;

load the wafer aligned by the aligner to the loadlock; and take the wafer out of the loadlock and send the wafer to the cassette.

19. The system according to claim 14, wherein:

the plurality of functional modules includes the loadlock; and the loadlock is configured to:

pump to an atmospheric condition;

exhaust to a vacuum condition;

transmit a wafer out of the loadlock; and receive a wafer into the loadlock.

20. The system according to claim 14, wherein:

the plurality of functional modules includes the process chamber; and the process chamber is configured to:

open a chamber valve;

execute a process flow of a wafer; and close the chamber valve.

* * * * *